United States Patent
Morizuka

(10) Patent No.: US 9,331,169 B2
(45) Date of Patent: May 3, 2016

(54) NITRIDE SEMICONDUCTOR SCHOTTKY DIODE AND METHOD FOR MANUFACTURING SAME

(71) Applicant: Kabushiki Kaisha Toshiba, Tokyo (JP)

(72) Inventor: Mayumi Morizuka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/682,672

(22) Filed: Apr. 9, 2015

(65) Prior Publication Data

US 2015/0214326 A1    Jul. 30, 2015

Related U.S. Application Data

(62) Division of application No. 13/788,394, filed on Mar. 7, 2013, now Pat. No. 9,059,327.

(30) Foreign Application Priority Data

Mar. 28, 2012    (JP) .................................. 2012-074275

(51) Int. Cl.
| | |
|---|---|
| *H01L 21/28* | (2006.01) |
| *H01L 29/66* | (2006.01) |
| *H01L 29/872* | (2006.01) |
| *H01L 29/20* | (2006.01) |

(Continued)

(52) U.S. Cl.
CPC .... *H01L 29/66143* (2013.01); *H01L 21/28581* (2013.01); *H01L 21/3065* (2013.01); *H01L 29/2003* (2013.01); *H01L 29/66212* (2013.01); *H01L 29/872* (2013.01)

(58) Field of Classification Search
CPC ...................... H01L 29/2003; H01L 29/66143; H01L 29/66212; H01L 29/872
USPC ............... 257/76–77, 40, 155, 192, 194, 500; 438/571, 253, 12, 191, 282

See application file for complete search history.

(56) References Cited

U.S. PATENT DOCUMENTS

| | | |
|---|---|---|
| 8,227,834 B2 | 7/2012 | Saito et al. |
| 2003/0183844 A1 | 10/2003 | Yokoyama et al. |

(Continued)

FOREIGN PATENT DOCUMENTS

| | | |
|---|---|---|
| JP | 2008-172055 A | 7/2008 |
| JP | 2008-177369 | 7/2008 |

(Continued)

OTHER PUBLICATIONS

Office Action mailed Aug. 20, 2014 in Granted U.S. Appl. No. 13/788,394.

(Continued)

*Primary Examiner* — Mohammed Shamsuzzaman
(74) *Attorney, Agent, or Firm* — Oblon, McClelland, Maier & Neustadt, L.L.P.

(57) ABSTRACT

According to an embodiment, a nitride semiconductor Schottky diode includes a first layer including a first nitride semiconductor and a second layer provided on the first layer and including a second nitride semiconductor having a wider band gap than the first nitride semiconductor. The diode also includes an ohmic electrode provided on the second layer and a Schottky electrode provided on the second layer. The second layer includes a region containing an acceptor in the vicinity of the Schottky electrode between the Schottky electrode and the ohmic electrode.

11 Claims, 7 Drawing Sheets

(51) Int. Cl.
*H01L 21/285* (2006.01)
*H01L 21/3065* (2006.01)

(56) References Cited

U.S. PATENT DOCUMENTS

| | | | |
|---|---|---|---|
| 2007/0114569 | A1 | 5/2007 | Wu et al. |
| 2007/0224710 | A1 | 9/2007 | Palacios et al. |
| 2007/0254431 | A1 | 11/2007 | Saito et al. |
| 2007/0295993 | A1 | 12/2007 | Chen et al. |
| 2008/0290371 | A1* | 11/2008 | Sheppard ............... H01L 21/046 257/192 |
| 2008/0308813 | A1* | 12/2008 | Suh ....................... H01L 29/402 257/76 |
| 2009/0039392 | A1 | 2/2009 | Herman |
| 2009/0057686 | A1 | 3/2009 | Fukuda et al. |
| 2009/0200576 | A1* | 8/2009 | Saito ................... H01L 29/7787 257/194 |
| 2009/0230331 | A1* | 9/2009 | Koudymov ......... H01L 29/7831 250/493.1 |
| 2010/0019279 | A1 | 1/2010 | Chen et al. |
| 2010/0320505 | A1 | 12/2010 | Okamoto et al. |
| 2011/0018002 | A1* | 1/2011 | Chen ................. H01L 21/28575 257/76 |
| 2012/0061729 | A1* | 3/2012 | Shibata ............. H01L 29/66462 257/194 |
| 2012/0217505 | A1* | 8/2012 | Ando .................. H01L 29/7787 257/76 |
| 2013/0083569 | A1* | 4/2013 | Minoura ........... H01L 29/66462 363/37 |

FOREIGN PATENT DOCUMENTS

| | | |
|---|---|---|
| JP | 2008-177369 A | 7/2008 |
| JP | 2009-218566 | 9/2009 |
| JP | 2011-3652 | 1/2011 |

OTHER PUBLICATIONS

Japanese Office Action issued Apr. 25, 2014 in Patent Application No. 2012-074275 with English Translation.

D. Song, et al., "Normally Off AlGaN/GaN Low-Density Drain HEMT (LDD-HEMT) with Enhanced Breakdown Voltage and Reduced Current Collapse", IEEE Electron Deviceletters, vol. 28, No. 3, Mar. 2007, pp. 189-191.

* cited by examiner

NITRIDE SEMICONDUCTOR SCHOTTKY DIODE AND METHOD FOR MANUFACTURING SAME

This application is a Divisional of U.S. application Ser. No. 13/788,394, filed on Mar. 7, 2013, now allowed.

CROSS-REFERENCE TO RELATED APPLICATIONS

This application is based upon and claims the benefit of priority from Japanese Patent Application No. 2012-074275, filed on Mar. 28, 2012; the entire contents of which are incorporated herein by reference.

FIELD

Embodiments are generally related to a nitride semiconductor Schottky diode and a method for manufacturing the same.

BACKGROUND

A nitride semiconductor electronic device has a high breakdown voltage and a small ON resistance compared to a conventional semiconductor electronic device, and its application to a compact and low-loss switching power source has been expected. Especially, a nitride semiconductor device that includes a hetero-interface between an undoped GaN layer and an undoped AlGaN layer exhibits a low-loss characteristic, owing to the two-dimensional electrons accumulated at the hetero-interface with high mobility and high concentration.

A switching element and a rectifying element are required in the switching power source circuit. When using an AlGaN/GaN field effect transistor so called high electron mobility transistor (HEMT) as the switching element, it is preferable to combine an AlGaN/GaN Schottky diode therewith, since both have breakdown voltages at about the same degree and operate at high speed.

However, the AlGaN/GaN Schottky diode has a large leak current under a reverse bias compared to a typical silicon Schottky diode. The reverse leak current of the AlGaN/GaN Schottky diode is low by about three figures compared to a forward current, whereas a reverse leak current of the silicon Schottky diode is low by about five figures. Hence, a reduction of the leak current is strongly desired in the AlGaN/GaN Schottky diode.

DETAILED DESCRIPTION

According to an embodiment, a nitride semiconductor Schottky diode includes a first layer including a first nitride semiconductor and a second layer provided on the first layer and including a second nitride semiconductor having a wider band gap than the first nitride semiconductor. The diode also includes an ohmic electrode provided on the second layer and a Schottky electrode provided on the second layer. The second layer includes a region containing an acceptor in the vicinity of the Schottky electrode between the Schottky electrode and the ohmic electrode.

Hereinbelow, embodiments will be described with reference to the drawings. In each of the drawings, like elements will be denoted by like numerals, and detailed explanations thereof will be appropriately omitted.

Figure 1:
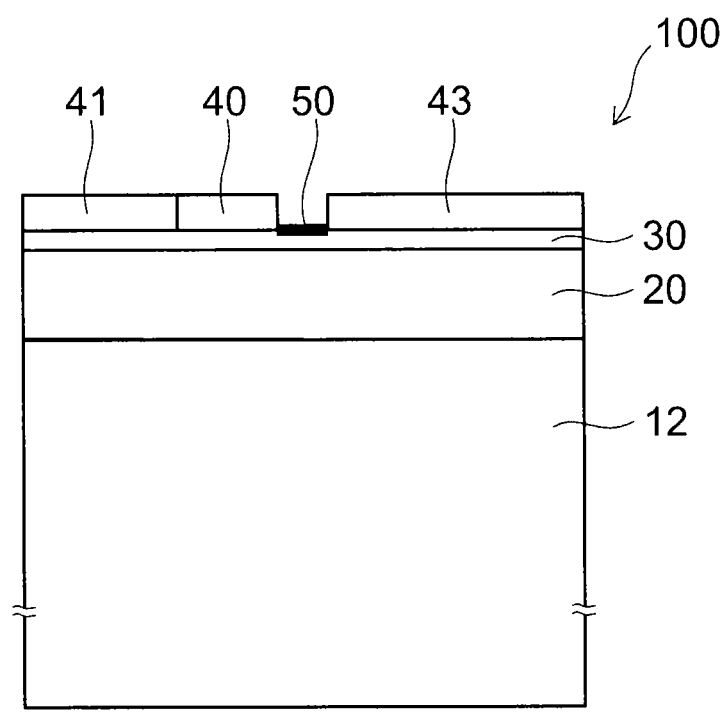
FIG. 1 is a schematic cross sectional view of a nitride semiconductor Schottky diode according to an embodiment.

FIG. 1 is a schematic cross sectional view of a nitride semiconductor Schottky diode according to an embodiment.

The nitride semiconductor Schottky diode (hereinbelow may be abbreviated simply as "Schottky diode") 100 according to the embodiment includes a base layer 12, a first layer 20 provided on the base layer 12, and a second layer 30 provided on the first layer 20.

A passivation film 40 is formed on the second layer 30, and parts of the passivation film 40 are opened, and an ohmic electrode 41 and a Schottky electrode 43 are formed therein. Further, among a region on a front surface side of the second layer 30, a region 50 containing an acceptor is provided at a peripheral portion of the Schottky electrode 43.

The base layer 12 may include one of various substrates such as sapphire, SiC, silicon, gallium nitride and the like, and a buffer layer and the like formed on such a substrate. Alternatively, the base layer 12 may be formed by growing the first layer 20 and the second layer 30 on the substrate of sapphire and the like via the buffer layer, thereafter removing at least a part of the substrate and the buffer layer, and newly adhering a supporting substrate and the like. In any case, in the embodiment, the base layer 12 is not an essential constituent feature.

The first layer 20 is composed of a first nitride semiconductor. The second layer 30 is composed of a second nitride semiconductor having a wider band gap than the first nitride semiconductor.

The "nitride semiconductor" referred to herein includes group III-V compound semiconductors of $In_xAl_yGa_{1-x-y}N$ ($0 \le x \le 1, 0 \le y \le 1, 0 \le x+y \le 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

For example, GaN may be used as the first nitride semiconductor configuring the first layer 20. Alternatively, InGaN, AlGaN, or InAlGaN may be used in the first layer 20.

One of non-doped or n-type $Al_xGa_{1-x}N$ ($0<X \le 1$), or $In_YAl_{1-Y}N$ ($0<Y \le 1$), or a mixture of non-doped or n-type $Al_XGa_{1-X}N$ ($0<X \le 1$) and $In_YAl_{1-Y}N$ ($0<Y \le 1$), or a laminate body of non-doped or n-type $Al_XGa_{1-X}N$ ($0<X \le 1$) and $In_YAl_{1-Y}N$ ($0<Y \le 1$) having a wider band gap than the first nitride semiconductor may be used as the second nitride semiconductor configuring the second layer 30.

A thickness of the second layer 30 may be about 5 nm to 50 nm, for example.

In such a laminated structure, a two-dimensional electron gas is generated in the first layer 20 in the vicinity of its interface with the second layer 30.

Further, in the embodiment providing the region 50 containing the acceptor in the peripheral portion of the Schottky electrode 43 may alleviate an electric field in the vicinity of the Schottky electrode 43, and may reduce a leak current.

Next, a method for manufacturing a Schottky diode will be described according to the embodiment.

FIGS. 2A to 3B are cross sectional views illustrating the manufacturing method of the Schottky diode.

Figure 2A:
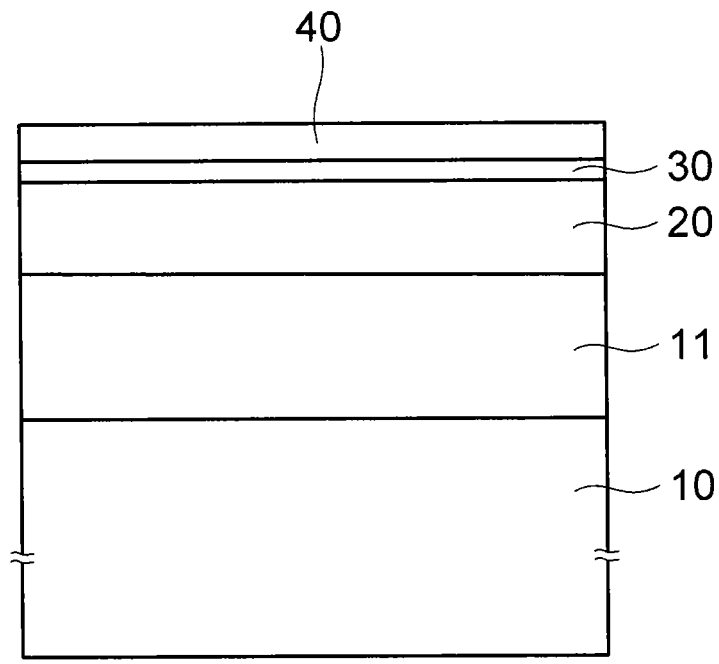
FIGS. 2A to 3B are cross sectional views illustrating the manufacturing method of the Schottky diode according to the embodiment.

As shown in FIG. 2A, a buffer layer 11 is formed on a substrate 10 such as a silicon wafer or the like. For example, an AlGaN/GaN superlattice layer may be formed as the buffer layer 11. A thickness of the buffer layer 11 may be 1 to 10 µm, for example.

Next, a GaN layer 20 with a thickness of 1 to 10 µm is grown on the buffer layer 11 as a first layer, and further, an AlGaN layer 30 with a thickness of 5 to 50 nm is grown thereon with a (0001) growth plane in a vertical direction of the substrate. For example, an MOCVD (Metal Organic Chemical Vapor Deposition), a hydride VPE (Vapor Phase Epitaxy), a molecular beam epitaxy (MBE) and the like may be used as a crystal growth method. An Al composition x in $Al_xGa_{(1-x)}N$ forming the AlGaN layer 30 is $0<x\leq1$.

A SiN film, for example, with a thickness of 10 to 500 nm is formed on the AlGaN layer 30 as the passivation film 40 using a method such as a PE-CVD (Plasma-Enhanced Chemical Vapor Deposition) and the like.

Figure 2B:
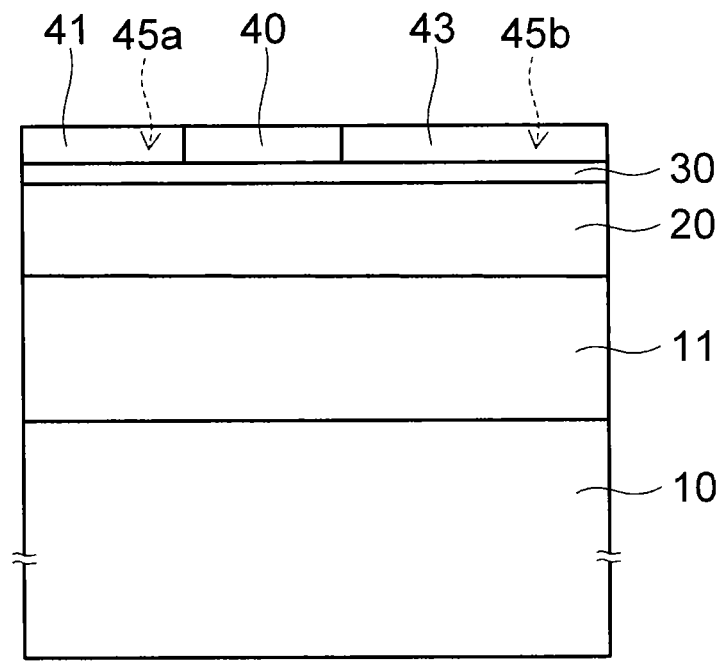

Next, as shown in FIG. 2B, parts of the passivation film 40 are opened by a photolithography technique. Further, in these openings 45a and 45b, a laminated film containing for example aluminum (Al) is formed as the ohmic electrode 41, and a laminated film containing for example nickel (Ni) is formed as the Schottky electrode 43.

Figure 3A:
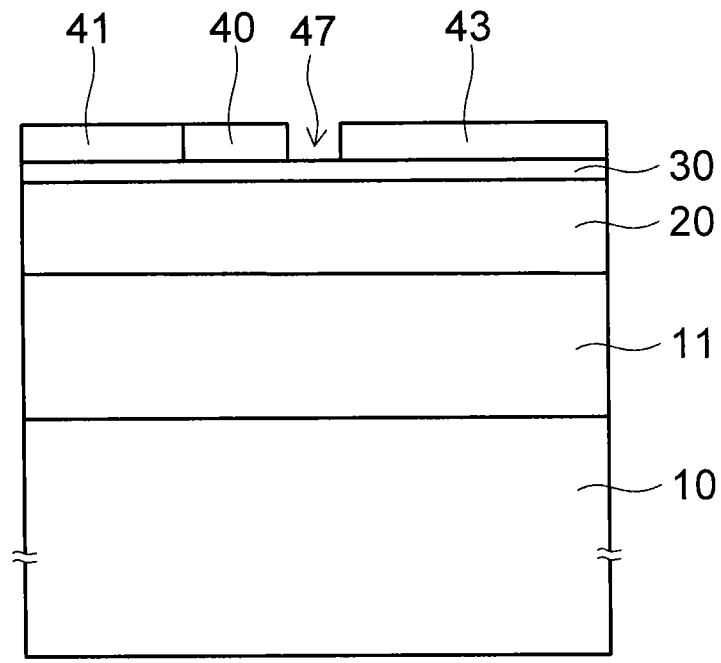

Next, a peripheral region 47 of the Schottky electrode 43 in the passivation film 40 is opened, and a surface of the AlGaN layer 30 is exposed as shown in FIG. 3A.

Figure 3B:
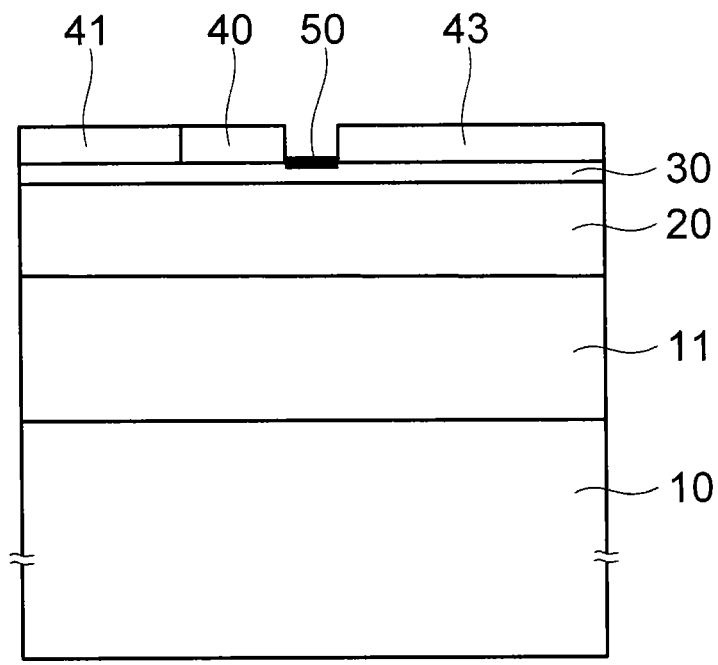

Then, the region 50 containing the acceptor is formed on the exposed surface of the AlGaN layer 30 as shown in FIG. 3B. Specifically, the region 50 is formed containing fluorine as the acceptor on the surface of the AlGaN layer 30, for example, using a plasma process exciting a gas containing a fluorine (F) compound. For example, $SF_6$ may be used as the fluorine compound. The plasma process may be performed using an ICP-RIE (Inductively Coupled Plasma-Reactive Ion Etching) at bias power of 10 to 60 W and exposing the surface of the AlGaN layer 30 to the plasma.

Note that, it may be possible to continuously carry out the processes shown in FIG. 3A and FIG. 3B. For example, the opening of the passivation film 40 and the forming of the region 50 containing the acceptor can be continuously carried out using the RIE exciting the gas containing fluorine such as $SF_6$. A condition of the RIE upon opening the passivation film 40 may be identical with a condition of the RIE upon forming the region 50 containing the acceptor, or each conditions may alternatively be changed appropriately.

After this, a passivation film, wirings and the like that are not shown may further be formed as needed.

As described above, the region 50 containing the acceptor can be formed by selectively introducing the acceptor such as fluorine to the surface of the second layer 30 in the vicinity of the Schottky electrode 43.

Next, advantageous effects of the embodiment will be described.

Figure 4:
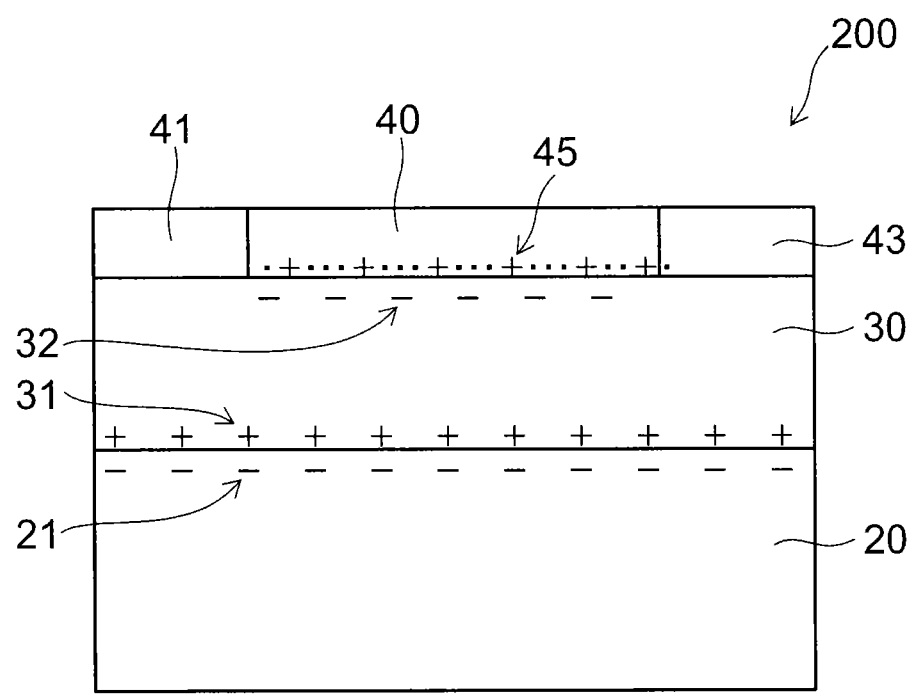
FIG. 4 is a schematic cross sectional view illustrating a Schottky diode according to a comparative example.

FIG. 4 is a schematic cross sectional view illustrating a Schottky diode of a comparative example.

Note that, only upper portions than the second layer 20 will be shown in the respective drawings after FIG. 4 for convenience. In a Schottky diode 200 of the comparative example, the region 50 containing the acceptor is not provided.

FIG. 4, also shows schematically a charge distribution in a non-operating state of the Schottky diode 200, that is, in a thermal equilibrium state. In a stacked structure in which the AlGaN layer 30 thinner than the GaN layer 20 by one figure or more is provided on the (0001) face of the GaN layer 20, positive fixed charges 31 are induced in the hetero interface between the GaN layer 20 and the AlGaN layer 30 due to a difference between spontaneous polarization charges in the two layers and piezoelectric charges caused by a lattice strain in the AlGaN layer 30. On the other hand, negative fixed charges 32 are accumulated at the surface of the AlGaN layer 30. Two-dimensional electrons 21 are accumulated in the hetero interface so as to cancel these fixed charges. This is a typical phenomenon caused in the stacked structure having a growth orientation of the [0001] direction. Furthermore, part of donor type surface levels existing with a high density is positively ionized at the surface of the AlGaN layer 30, also cancelling the charges.

Figure 5A:
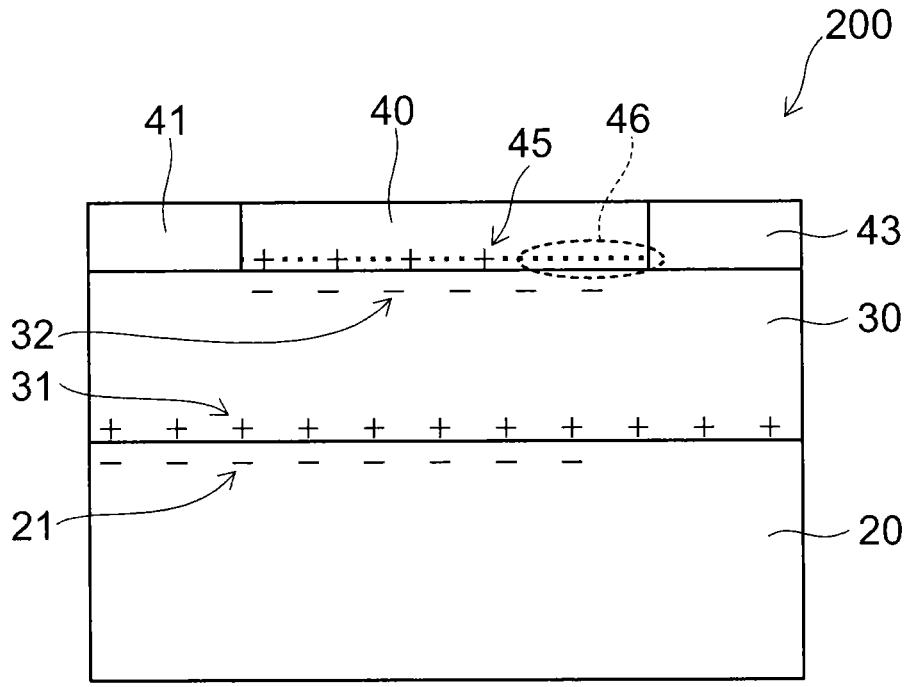
FIGS. 5A and 5B are schematic views illustrating charge distributions under a reverse bias condition in the Schottky diodes.
Figure 5B:
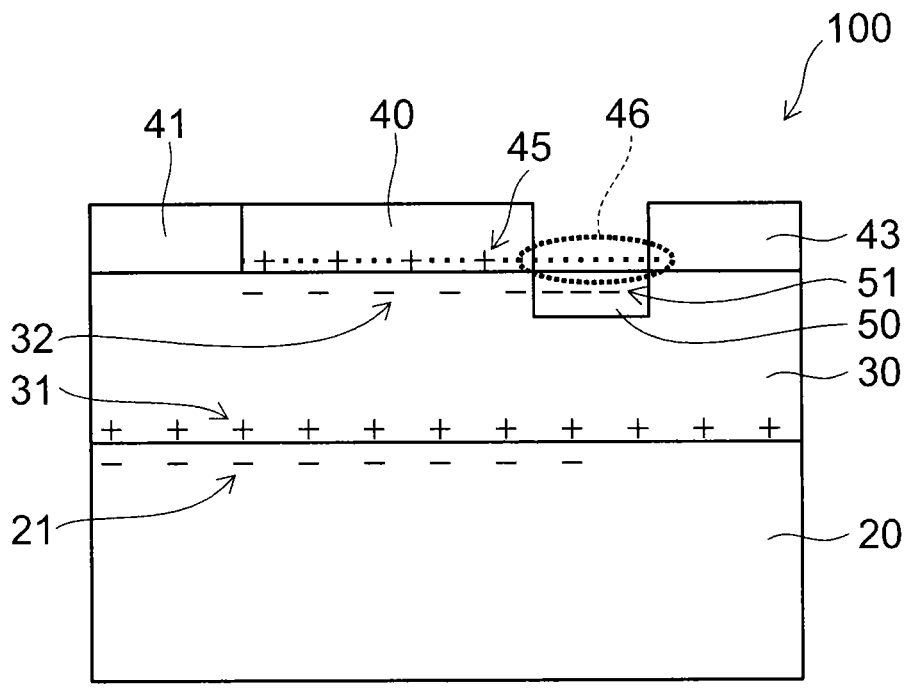

FIG. 5A is a schematic view illustrating a charge distribution under a reverse bias condition in the Schottky diode of the comparative example, and FIG. 5B is a schematic view illustrating a charge distribution under a reverse bias condition in the Schottky diode of the embodiment.

Firstly, the comparative example shown in FIG. 5A will be described.

When a reverse bias is applied to the Schottky diode 200 of the comparative example, extremely high electric field is generated in the vicinity of the Schottky electrode 43. The donor type surface level may capture an electron in the high electric field. As a result, a region 46 in which the donor type surface levels are neutralized is formed in the vicinity of the Schottky electrode 43. Hence, the negative fixed charges are left at the surface of the AlGaN layer.

On the other hand, when applying a reverse bias to the Schottky diode 100 according to the embodiment, a neutralized region 46 is also formed under the high electric field in the vicinity of the surface of the AlGaN layer 30. In addition, since there is the region 50 containing the acceptor in the Schottky diode 100, where the negative charges 51 are present, a total amount of the negative charges becomes larger than the comparative example shown in FIG. 5A. Thus, the electric field intensity in the vicinity of the Schottky electrode 43 is lowered by making the negative charge density higher, and thereby, it is possible to reduce the reverse leak current.

Figure 6A:
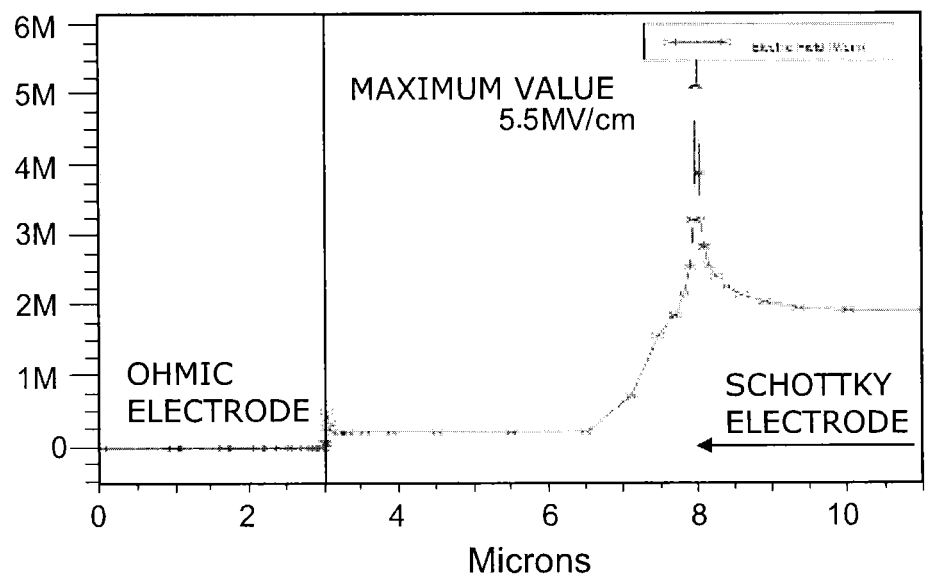
FIGS. 6A and 6B are graphs illustrating field intensity distributions in the Schottky diodes.
Figure 6B:
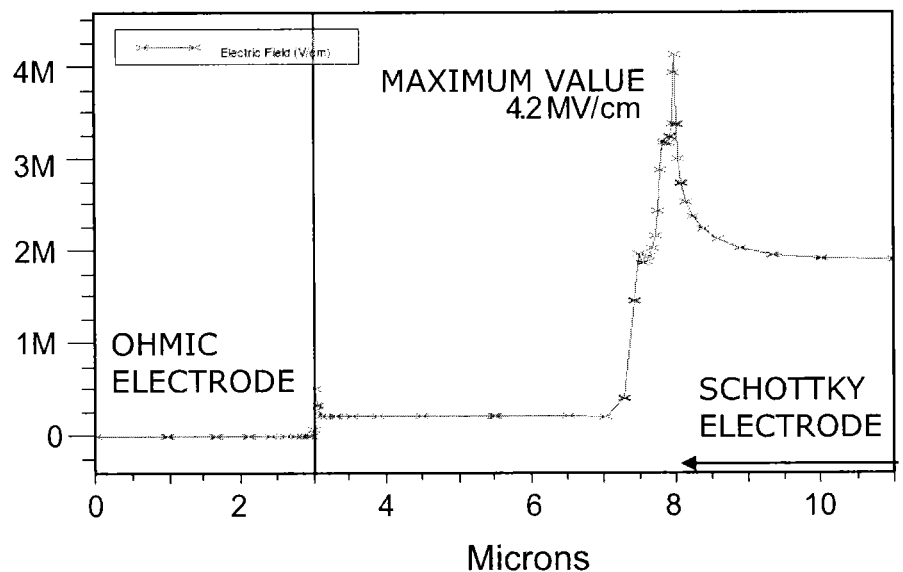

FIGS. 6A and 6B are graphs showing electric field distributions in the Schottky diodes of the comparative example and the embodiment obtained by a device simulation. Horizontal axes of FIGS. 6A and 6B show positions (micrometers) in the surfaces of the AlGaN layers 30, and vertical axes thereof show the field intensities (V/cm) when the reverse bias of 100 V is applied to the Schottky electrodes 43.

In the graphs of FIGS. 6A and 6B, regions in the range from 0 to 3 micrometers along the horizontal axes correspond to the ohmic electrodes 41, and regions in the range from 8 to 11 micrometers correspond to the Schottky electrodes 43.

As can be found in FIG. 6A, a peak of electric field is present in the vicinity of an end portion of the Schottky electrode 43, and intensity thereof is about 5.5 MV/cm in the Schottky diode 200 of the comparative example. Contrary to this, as can be found in FIG. 6B, the intensity of the peak of the electric field in the vicinity of the end portion of the Schottky electrode 43 is reduced to about 4.2 MV/cm in the Schottky diode 100 of the embodiment.

Figure 7:
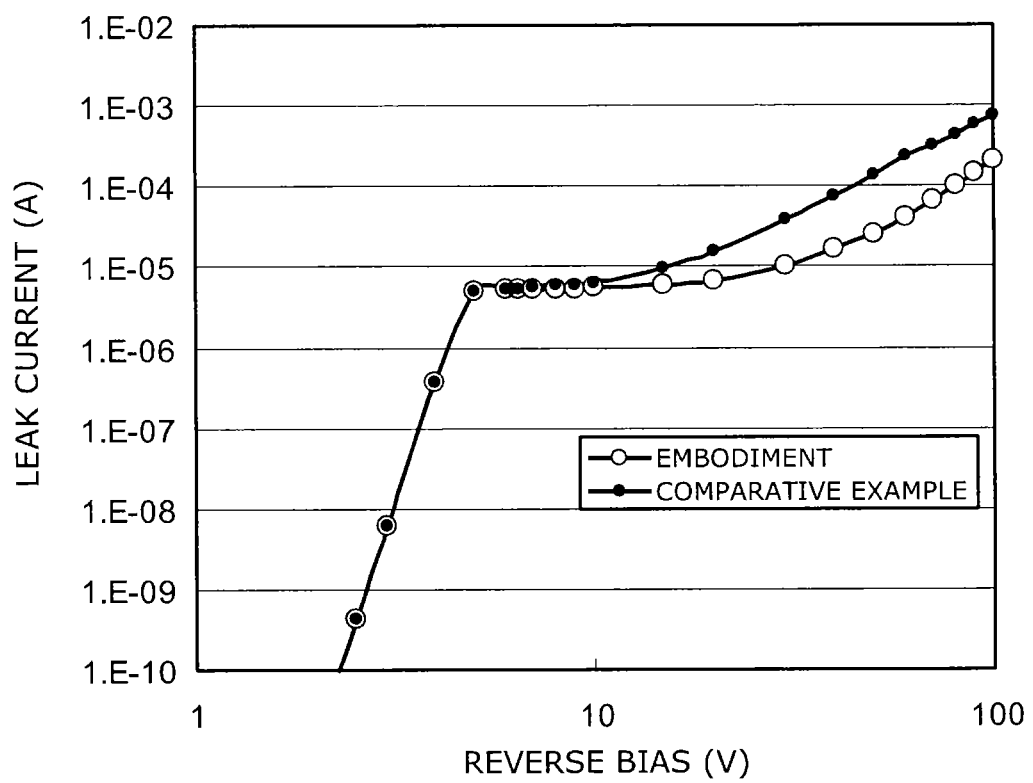
FIG. 7 is a graph illustrating reverse leak currents of the Schottky diodes.

FIG. 7 is a graph showing simulated results of the reverse leak current. A horizontal axis shows a reverse bias voltage, and a vertical axis shows the reverse leak current, respectively.

As the reverse bias voltage increases, it can be found that the leak current is reduced at a larger degree in the Schottky diode 100 of the embodiment than in the Schottky diode 200 of the comparative example. Further, when the reverse bias becomes higher than 10 V, the leak current can be reduced in the embodiment compared to the comparative example. For example, when the reverse bias of 100 V, that is, minus 100 V, is applied to the Schottky electrodes 43, the leak current in the comparative example is about $1\times10^{-3}$ A, whereas it is suppressed to about $2\times10^{-4}$ A in the embodiment.

Accordingly, forming the region 50 containing the acceptor on the surface of the AlGaN layer 30 may reduce the reverse leak current. On the other hand, electron potential in the region 50 containing the acceptor rises in the thermal equilibrium state, and thereby a two-dimensional electron density just below this region may decrease. When the region containing the acceptor is formed near the hetero interface between the GaN layer 20 and the AlGaN layer 30, the two-dimensional electron density may decrease significantly, thereby making an ON resistance increase.

Hence, the thickness (depth) of the region 50 containing the acceptor is preferably adjusted so that providing the region 50 containing the acceptor becomes effective on the front surface side and an influence thereof becomes relatively low at the hetero interface. Specifically, it is desirable to form the region 50 with ½ or less thickness (depth) f of the AlGaN layer 30.

The region 50 containing the acceptor in the embodiment effectively reduces the electric field on the surface of the AlGaN layer, where the acceptor may simply be introduced at a high concentration only at the surface of the AlGaN layer 30. As described above referring to FIG. 3B, it is advantageous for introducing the acceptor to use the plasma process exciting the gas containing the compound containing fluorine. That is, according to the plasma process as above, the selective introduction of the acceptor can easily be performed at a high concentration only to the vicinity of the surface of the AlGaN layer 30.

On the other hand, it is more effective for reducing the leak current to make a width of the region 50 containing the acceptor (a size in a left and right direction in FIG. 1 and FIG. 6) wider. That is, the leak current may be reduced more effectively even at a high reverse voltage with the wider width of the region 50 containing the acceptor.

On the other hand, when the width of the region 50 containing the acceptor is made wider, a parasitic resistance increases and a loss in the forward direction is increased. Therefore, the width of the region 50 containing the acceptor is desirably set at ½ or less of an interval between the Schottky electrode 43 and the ohmic electrode 41.

In the above, embodiments have been explained with reference to specific examples. However, the embodiments are not limited to these specific examples. That is, those to which a person skilled in the art adds modifications as needed are included in the scope of the embodiments so long as the features of the embodiments are included therein. The respective components provided in the respective specific examples as described above, and arrangements, materials, conditions, shapes, sizes and the like thereof are not limited to those exemplified, and they may be changed appropriately.

Further, the respective components provided in the respective embodiments can be combined so long as such combinations are technically available, and such combinations are included in the scope of the embodiments so long as the features of the embodiments are included therein. Other than the above, a person skilled in the art would understand that various changes and modifications may be conceived within the scope of the spirit of the embodiment, and such changes and modifications are included in the scope of the embodiments so long as the features of the embodiments are included therein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the method comprising:
   forming a passivation film on a second layer of a laminated body including a first layer of a first nitride semiconductor, and the second layer provided on the first layer and including a second nitride semiconductor having a broader band gap than the first nitride semiconductor and a thickness between 5 to 50 nm;
   forming an ohmic electrode in a first opening part provided by removing a first part of the passivation film;
   forming a Schottky electrode in in a second opening part provided by removing a second part of the passivation film;
   forming a third opening part by removing a third part of the passivation film in the vicinity of the Schottky electrode;
   introducing an acceptor to a surface of the second layer exposed on a bottom of the third opening part through the third opening part between the passivation film and the Schottky electrode;
   wherein the acceptor is distributed from the surface of the second layer to a depth less than a half thickness of the second layer and a region containing the acceptor in the third opening part extends from an end on the Schottky electrode side to ½ or less of an interval between the Schottky electrode and the ohmic electrode.

2. The method according to claim 1, wherein the first layer and the second layer are grown in a vertical direction with respect to a (0001) plane.

3. The method according to claim 1, wherein the acceptor is introduced using plasma exciting a gas containing fluorine.

4. The method according to claim 3, wherein the gas containing fluorine is $SF_6$.

5. The method according to claim 1, wherein the acceptor is introduced in the surface of the second layer through processes of removing the third part of the passivation film in the vicinity of the Schottky electrode using the plasma exciting the gas containing fluorine, and exposing the surface of the second layer to the plasma.

6. The method according to claim 5, wherein the passivation film is a SiN film.

7. The method according to claim 3, wherein the nitride semiconductor is represented by the formula $In_xAl_yGa_{1-x-y}N$, wherein $0\leq x\leq 1$, $0\leq y\leq 1$, $0\leq x+y\leq 1$.

8. The method according to claim 3, wherein the first nitride semiconductor is GaN.

9. The method according to claim 3, wherein the first nitride semiconductor is InGaN, AlGaN, or InAlGaN.

10. The method according to claim 3, wherein the second nitride semiconductor is a non-doped or n-type $Al_xGa_{1-x}N$ ($0<X\leq 1$), or $In_YAl_{1-Y}N(0<Y\leq 1)$, or a mixture of non-doped or n-type $Al_xGa_{1-x}N(0<X\leq 1)$ and $In_YAl_{1-Y}N$ ($0<Y\leq 1$), or a laminate body of non-doped or n-type $Al_XGa_{1-X}N$ ($0<X\leq1$) and $In_YAl_{1-Y}N$ ($0<Y\leq1$) having a wider band gap than the first nitride semiconductor.

11. The method according to claim 3, wherein the acceptor contains fluorine.

* * * * *